United States Patent
Cheng et al.

(10) Patent No.: US 8,592,248 B2
(45) Date of Patent: *Nov. 26, 2013

(54) ETCHING METHOD FOR USE WITH THIN-FILM PHOTOVOLTAIC PANEL

(75) Inventors: Lap-Tak Andrew Cheng, Newark, DE (US); Meijun Lu, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 137 days.

This patent is subject to a terminal disclaimer.

(21) Appl. No.: 13/239,854

(22) Filed: Sep. 22, 2011

(65) Prior Publication Data

US 2012/0122270 A1    May 17, 2012

Related U.S. Application Data

(60) Provisional application No. 61/414,474, filed on Nov. 17, 2010.

(51) Int. Cl.
*H01L 21/00* (2006.01)

(52) U.S. Cl.
USPC .......... 438/98; 438/64; 438/57; 438/80; 438/96; 438/74

(58) Field of Classification Search
USPC ............ 438/98, 64, 57, 80, 96, 74, 86, 62, 48
See application file for complete search history.

(56) References Cited

U.S. PATENT DOCUMENTS

| | | | |
|---|---|---|---|
| 3,004,919 A | 10/1961 | Rush et al. | |
| 4,759,191 A | 7/1988 | Thomas et al. | |
| 5,296,043 A * | 3/1994 | Kawakami et al. | 136/244 |
| 5,385,848 A * | 1/1995 | Grimmer | 438/62 |
| 5,391,235 A | 2/1995 | Inoue | |
| 5,688,366 A * | 11/1997 | Ichinose et al. | 438/754 |
| 5,766,504 A | 6/1998 | Shoji et al. | |
| 5,846,450 A | 12/1998 | Atkinson | |
| 5,894,853 A | 4/1999 | Fujisaki et al. | |
| 6,177,025 B1 | 1/2001 | Ring et al. | |
| 6,271,462 B1 | 8/2001 | Tsuzuki et al. | |
| 6,294,722 B1 | 9/2001 | Kondo et al. | |

(Continued)

FOREIGN PATENT DOCUMENTS

| | | |
|---|---|---|
| JP | H02-42766 * | 2/1990 |
| WO | 0067878 A1 | 11/2000 |
| WO | 2009000628 A1 | 12/2008 |
| WO | 2009097588 A2 | 8/2009 |

OTHER PUBLICATIONS

Nonfinal Rejection of U.S. Appl. No. 13/239,893 filed Feb. 15, 2013.*

(Continued)

*Primary Examiner* — Telly Green

(57) ABSTRACT

The present invention relates to a chemical etching method to electrically isolate the edge from the interior of a thin-film photovoltaic panel comprising a substrate and a photovoltaic laminate. The method comprises a step to dispense an etching paste comprising two or more acids on the laminate periphery; an optional step to apply heat to the laminate; and a step to remove the etching paste. The method is further characterized by the chemical removal of at least two chemically distinctive layers of the laminate at the periphery where the etching paste is applied. The method may be used to produce a thin-film photovoltaic panel.

9 Claims, 1 Drawing Sheet

(56) References Cited

U.S. PATENT DOCUMENTS

| | | |
|---|---|---|
| 6,300,556 B1 | 10/2001 | Yamagishi et al. |
| 6,388,187 B1 | 5/2002 | Takeyama et al. |
| 6,432,319 B1 | 8/2002 | Ring et al. |
| 6,966,184 B2 | 11/2005 | Toyomura et al. |
| 7,196,018 B2 | 3/2007 | Szlufcik et al. |
| 8,013,237 B2 * | 9/2011 | Li .................................. 136/248 |
| 2002/0033471 A1 | 3/2002 | Odle et al. |
| 2002/0038863 A1 | 4/2002 | Walker |
| 2004/0118446 A1 | 6/2004 | Toyomura |
| 2005/0121067 A1 | 6/2005 | Toyomura et al. |
| 2006/0005874 A1 * | 1/2006 | Ferri et al. .................... 136/251 |
| 2008/0028786 A1 | 2/2008 | Bruzzo |
| 2008/0223436 A1 * | 9/2008 | den Boer et al. .............. 136/256 |
| 2008/0314124 A1 | 12/2008 | Sweeney et al. |

OTHER PUBLICATIONS

Dirksen, James A. et al., Testing of crystallization inhibitors in industrial LiBr solutions, International Journal of Refrigeration, 2001, pp. 856-859, vol. 24, Elsevier Science Ltd.

Ring, Terry Arthur et al., LiBr 2H20 Crystallization Inhibition in the Presence of Additives, Journal of Colloid and Interface Science, 2001, pp. 399-408, vol. 239, Academic Press.

* cited by examiner

ETCHING METHOD FOR USE WITH THIN-FILM PHOTOVOLTAIC PANEL

FIELD OF THE INVENTION

The present invention relates to a chemical etching method for removing material from the edge of a photovoltaic panel, useful in the manufacture of thin-film photovoltaic panels.

BACKGROUND

A photovoltaic panel converts radiation energy into electrical energy. The energy conversion occurs as the result of the photovoltaic effect. Of particular recent interest is the large-scale and cost-effective conversion of solar radiation (sunlight) into electricity using arrays of photovoltaic cells assembled into photovoltaic panels.

Thin-film photovoltaic panels are typically manufactured via a multi-step process, one stage of which is the assembly of a photovoltaic laminate on a substrate. During the physical vapor and chemical vapor deposition steps of manufacturing the photovoltaic laminate, it can be difficult to prevent the transparent conductive oxide (TCO), the absorber (e.g., amorphous silicon), and metallic layers from depositing on the outer edges of a glass substrate. Having such conductive materials in the edge region of the panel is problematic because it can lead to electrical shorts with the photovoltaic panel frame or other installation-related structural members. The edge region is also vulnerable to corrosion, even after back-sheet or back-glass encapsulation. Corrosion of the edge region can also result in electrical shorts and premature panel failure. Therefore it is necessary to isolate the edge electrically from the interior of the panel.

U.S. Pat. No. 6,294,722 discloses the use of a frame to cover a perimeter region of the substrate, thus preventing deposition of silicon on the substrate edge. A frame was also used to cover an expanded perimeter region of the substrate to prevent deposition of the back electrode layer on the substrate edge. In addition, an isolation groove made by two laser scribing steps was located inward of the expanded perimeter region and around the entire substrate perimeter.

U.S. Pat. No. 6,300,556 discloses the removal of at least part of at least one layer of the first electrode layer, the semiconductor layer and the second electrode layer at the substrate periphery by mechanical means or a laser beam.

There remains a need, however, for a method of removing material from the edge of a photovoltaic laminate that is easy to use, efficient, and does not lead to contamination of the laminate or the clean room with particulates.

SUMMARY

One aspect of the invention is a method comprising:
(a) providing a thin-film photovoltaic panel comprising:
   (i) a substrate having an interior area and a periphery; and
   (ii) a photovoltaic laminate comprising a front electrode layer, a back electrode layer, and a photovoltaic junction layer disposed between the front electrode and the back electrode and optionally on at least a portion of the periphery of the substrate,
   wherein the photovoltaic laminate has a periphery and an interior area, and
   wherein the front electrode is disposed on the substrate at least in the interior area;
(b) dispensing an etching paste on at least a portion of the periphery of the photovoltaic laminate;
(c) optionally heating the etching paste; and
(d) after a predetermined dwell time, removing the etching paste to remove at least two layers in the periphery.

This method removes conductive material from the periphery of a thin-film photovoltaic panel so as to isolate electrically the periphery from the interior of the panel.

DETAILED DESCRIPTION

Figure 1A:
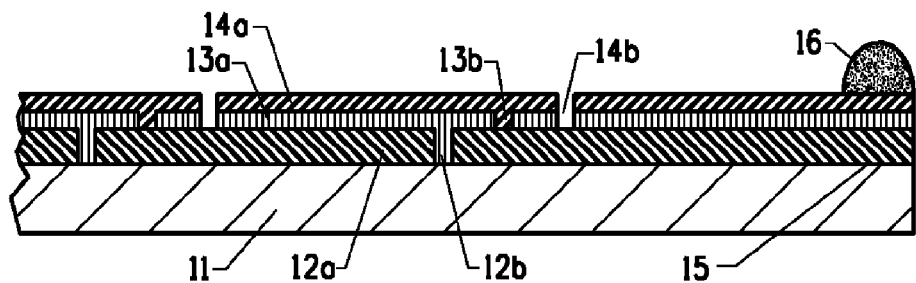
FIG. 1A is a cross-sectional view of a thin-film photovoltaic panel showing a substrate edge coated with a photovoltaic laminate onto which an etching paste has been deposited.

The present invention provides a method for electrically isolating the periphery of a thin-film photovoltaic panel from the interior of the thin-film photovoltaic panel via chemical etching.

According to the present invention, the thin-film photovoltaic panel comprises a substrate and a photovoltaic laminate having a front electrode layer, a photovoltaic junction layer, a back electrode layer. The photovoltaic panel has a periphery, and an interior area. The front electrode layer is disposed on the substrate at least in the interior area.

The photovoltaic junction layer is disposed between the front and back electrodes and optionally on the periphery of the substrate.

As defined herein, the "periphery" is the portion of the thin-film photovoltaic panel, substrate or photovoltaic laminate closest to the edge of the substrate. In some embodiments, the periphery is the portion of the thin-film photovoltaic panel, substrate or photovoltaic laminate less than about 2 cm or 1.5 cm or 1 cm or 0.5 cm or 0.25 cm from the edge of the substrate.

As defined herein, the "interior" is the portion of the thin-film photovoltaic panel, substrate or photovoltaic laminate that is at least 0.25 cm or 0.5 cm or 1.0 cm or 1.5 cm or 2.0 cm from the nearest edge of the thin-film photovoltaic panel.

Glass, metal, or polymer can be employed as the substrate of a thin-film photovoltaic panel. The front electrode layer comprises one or more layers of metal such as silver, or metal oxides such as impurity-doped tin oxide, zinc oxide, or indium oxide. The back electrode comprises one or more layers of metal such as silver or metal oxides such as ZnO. At least one of the front electrode layer and the back electrode layer is transparent. The thin-film photovoltaic junction layer comprises doped and/or intrinsic (undoped) semiconductors such as silicon and silicon alloys.

One embodiment of the chemical etching method for edge electrical isolation in a thin-film photovoltaic panel comprises dispensing an etching paste comprising one or more etchants onto the periphery of the photovoltaic laminate, optionally heating the etching paste, removing the etching paste after a pre-determined time, and then rinsing the photovoltaic laminate to remove the etching paste and/or its residues and any proportion of the photovoltaic laminate that came into contact with the etching paste. This method can be used to remove more than one layer of the photovoltaic laminate in the periphery area where the etching paste is applied.

The etching paste comprises an acidic etchant and a binder. The acidic etchant comprises at least two acids selected from the group of nitric acid, hydrochloric acid, and hydrofluoric acid. The binder comprises polymeric materials selected from the group consisting of poly(vinyl alcohol), poly(ethylene oxide), polyvinylpyrrolidone (PVP), poloxamers and mixtures thereof. Poloxamers are nonionic triblock copolymers composed of a central hydrophobic chain of polyoxypropylene, flanked by two hydrophilic chains of polyoxyethylene. The etching paste can be applied to the periphery of the laminate by dispensers selected from the group consisting of nozzles, screens, rollers, brushes, and slot dies.

In some thin-film photovoltaic panels, two or more layers of chemically distinct materials are used to form the back electrode. For such photovoltaic panels, the etchant paste can comprise a mixture of acids to remove the chemically distinct materials. For example, if a dual layer back electrode comprises a first layer of ZnO and a second layer of silver, a mixture of hydrochloric acid and nitric acid can be used as the etchant to remove portions of both the ZnO and silver layers.

In one embodiment, the front electrode is doped ZnO and the back electrode is silver. A bead of etching paste containing silver etchants, silicon etchants, and ZnO etchants, such as a combination of nitric, hydrochloric, and hydrofluoric acids, is dispensed on the back electrode surface at its periphery area. The bead which is about 0.5 cm in width can be dispensed using a nozzle, a screen, a roller, or other appropriate means. The etching paste is allowed to chemically etch the photovoltaic laminate for 1 to 2 minutes depending on the concentration of the etchant and the thickness of the photovoltaic laminate. Optionally, the etchant can be heated to a temperature up to about 150° C. in order to reduce the required etching time. The periphery is then rinsed with water or an aqueous alkaline solution in order to remove the etching paste, thus revealing a substrate edge that is free of the photovoltaic laminate.

In some photovoltaic panel configurations, the front electrode layer comprises a material that is difficult to remove by etching and it must be removed from the periphery regions prior to the deposition of the photovoltaic junction layer and the back electrode layer. For example, if the front electrode layer is fluorine-doped tin oxide (FTO), it must be removed from the periphery of the substrate prior to the deposition of the photovoltaic junction layer and the back electrode layer. The periphery portion of the front electrode layer can be removed by mechanical grinding or sand blasting. As a result of removing the front electrode layer from the periphery of the substrate, both the photovoltaic junction layer and the back electrode layer will extend beyond the edge of the front electrode layer. The photovoltaic junction layer will then be disposed on the bare substrate surface in the periphery region. To isolate the edge of the photovoltaic panel, a bead of etching paste is dispensed on the back electrode surface near the substrate edge. After an appropriate dwell time and an optional heating step, the laminate is washed to reveal an edge, which now has a bare substrate surface.

Embodiments of this invention are further illustrated in FIGS. 1A-1B and FIGS. 2A-2B.

The thin-film photovoltaic panel shown in FIG. 1A before etching comprises a substrate 11, a front electrode 12a, and a plurality of breaks 12b to divide the front electrode layer into strips of cell electrodes. There are also one or more amorphous silicon junction layers 13a separated by breaks 13b, and back electrode layers 14a. The stack formed by the junction and back electrode layers is divided into strips of series-connected cells, with the cell back electrodes separated by breaks 14b. All layers of the photovoltaic laminate extend to the substrate edge 15. A bead of etchant paste 16 is disposed on the periphery of the back electrode of the photovoltaic laminate.

Figure 1B:
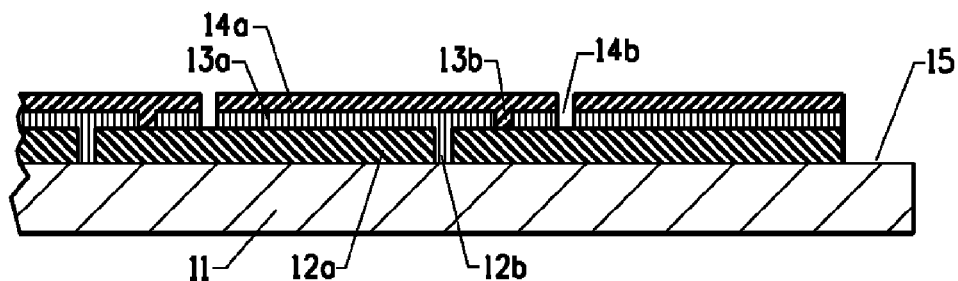
FIG. 1B is a cross-sectional view of a thin-film photovoltaic panel showing a bare substrate edge, in which all layers of the photovoltaic laminate have been removed using an etching paste, thereby exposing the underlying substrate and electrically isolating the edge from the interior.

FIG. 1B shows the same photovoltaic panel after etching and after removal of the etching paste. In this embodiment, the etchant paste has removed portions of the back electrode 14a, photovoltaic junction 13a, and front electrode from the periphery of the photovoltaic laminate, exposing the substrate edge 15 causing an electrical isolation of the thin-film photovoltaic panel by electrically isolating the edge of the photovoltaic panel from the thin-film interior of the panel.

Figure 2A:
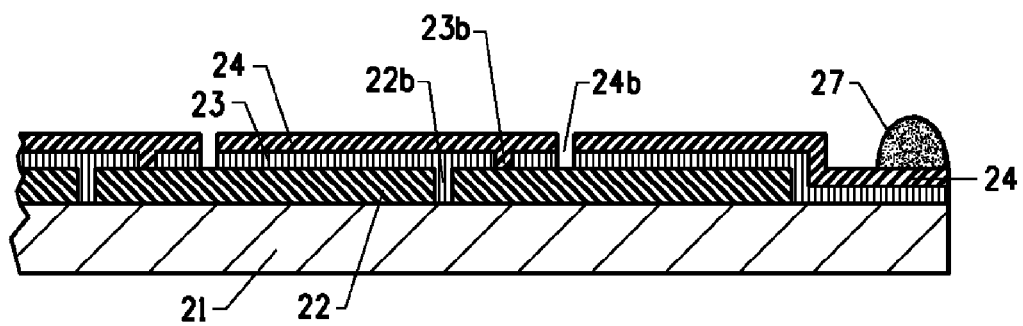
FIG. 2A is a cross-sectional view of a thin-film photovoltaic substrate showing a substrate edge onto which an etching paste has been deposited, and where the photovoltaic junction layer is in contact with the substrate in the edge region.

The thin-film photovoltaic panel shown in FIG. 2A before etching comprises a substrate 21, a front electrode 22, and a plurality of breaks 22b that divide the electrode layer into strips of cell electrodes. There are also one or more amorphous silicon junction layers 23 separated by breaks 23b, and back electrode layers 24 separated by breaks 24b. In this panel, the front electrode layer does not extend all the way to the edge of the substrate, and consequently the portion of the amorphous silicon junction layer near the edge of the substrate is in direct contact with the substrate. A bead of etchant paste 27 is disposed on the periphery of the back electrode 24 of the photovoltaic panel.

Figure 2B:
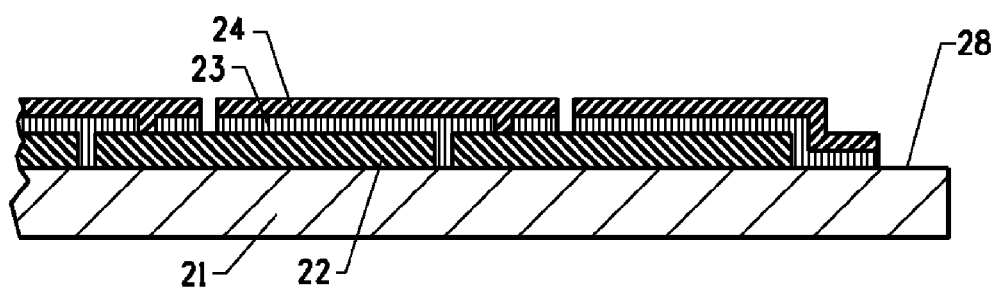
FIG. 2B is a cross-sectional view of a thin-film photovoltaic panel showing a bare substrate edge, in which both the back electrode and silicon layers have been removed using an etching paste.

FIG. 2B shows the same photovoltaic panel after etching which caused removal of the etching paste. In this embodiment, the etchant paste has removed portions of the back electrode 24 and amorphous silicon junction layer 23 from the periphery of the photovoltaic panel, exposing the substrate edge 28 causing an electrical isolation of the thin-film photovoltaic panel by electrically isolating the edge of the photovoltaic panel from the thin-film interior of the panel.

What is claimed is:

1. A method comprising:
    (a) providing a thin-film photovoltaic panel comprising:
        (i) a substrate having an interior area and a periphery; and
        (ii) a photovoltaic laminate comprising a front electrode layer, a back electrode layer, and a photovoltaic junction layer disposed between the front electrode layer and the back electrode layer,
        wherein the photovoltaic laminate has a periphery and an interior area, and wherein the front electrode is disposed on the substrate at least in the interior area;
    (b) disposing an etching paste on at least a portion of the periphery of the photovoltaic laminate;
    (c) optionally heating the etching paste; and
    (d) after a predetermined dwell time, removing the etching paste to remove at least two layers in the periphery.

2. The method according to claim 1, wherein the etching paste is dispensed using one or more dispensers selected from the group consisting of nozzles, screens, rollers, brushes, and slot dies.

3. The method according to claim 1, wherein the etching paste is an acidic etchant comprising at least two acids selected from the group of nitric acid, hydrochloric acid, and hydrofluoric acid.

4. The method according to claim 1, wherein the etching paste is heated up to 150° C.

5. The method according to claim 1, further comprising (e) rinsing with water or an aqueous alkaline solution.

6. The method according to claim 1, wherein the front electrode layer is transparent.

7. The method according to claim 1, wherein the back electrode layer is transparent.

8. The method according to claim 1, wherein a portion of the photovoltaic junction layer is disposed on at least a portion of the substrate in the periphery.

9. The method according to claim 1, wherein the etching paste is disposed on substantially all the periphery of the photovoltaic laminate.

\* \* \* \* \*